Sept. 25, 1956 C. E. CADY ET AL 2,764,742

VARIABLE TUNING STRUCTURES

Filed Sept. 16, 1952 2 Sheets-Sheet 1

Inventors:
Charles E. Cady,
Roswell W. Wagner,
by Merton D Morse
Their Attorney.

VARIABLE TUNING STRUCTURES

Filed Sept. 16, 1952 2 Sheets-Sheet 2

Inventors:
Charles E. Cady,
Roswell W. Wagner,
by Merton D. Moore
Their Attorney.

United States Patent Office 2,764,742
Patented Sept. 25, 1956

2,764,742

VARIABLE TUNING STRUCTURES

Charles E. Cady, North Syracuse, and Roswell W. Wagner, Buffalo, N. Y., assignors to General Electric Company, a corporation of New York Application September 16, 1952, Serial No. 309,923
2 Claims. (Cl. 333—82)

Our invention relates to variable tuning structures for use in high-frequency circuits, and more particularly, to structures suitable for tuning high-frequency circuits of very-high-frequency and ultra-high-frequency television receivers and the like.

Resonant circuits comprising inductance and capacitance may be tuned to resonance at various desired frequencies by varying the inductance or capacitance. In certain applications, particularly at the higher frequencies, it is advantageous to utilize inductance tuning methods rather than capacitance tuning methods.

Certain inductance tuning devices have been previously developed that employ a solenoid-wound coil and a tuning member which is constructed to make threaded engagement therewith and which may be inserted an adjustable distance into the coil to vary its inductance. The useful tuning range of such devices is limited, however, in higher frequency circuits as those employed in the very-high-frequency and ultra-high-frequency television receivers and the like.

It is an object of our invention to provide new and improved structures of this general type particularly suitable for tuning very-high-frequency and ultra-high-frequency circuits.

Another object of our invention is to provide improved tuning structures, particularly suitable for use in very-high-frequency and ultra-high-frequency television circuits and the like, that can readily be adjusted over relatively wide frequency ranges.

It is a further object of our invention to provide improved tuning structures for very-high-frequency and ultra-high-frequency television circuits and the like that are compact, simple to manufacture, readily adaptable to mass production methods of fabrication.

Very briefly, the present invention relates to inductance tuning structures comprising a bifilar-wound coil of helical configuration and a double-threaded tuning member of conductive material constructed to make threaded engagement with the adjacent conductors of said coil for adjustably short-circuiting the turns of said coil in order to vary its inductance.

For additional objects and advantages, and for a better understanding of the invention, attention is now directed to the following description and accompanying drawing. The features of the invention which are believed to be novel are particularly pointed out in the appended claims.

Referring to the drawing.

Figure 1:
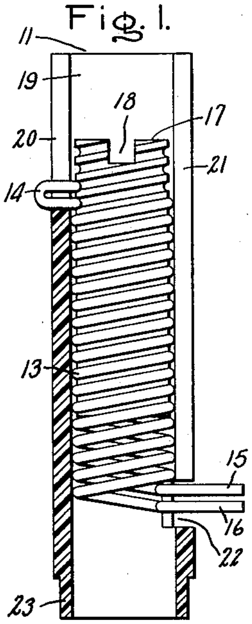
Fig. 1 is an elevational view, partly in section, of one form of variable tuning structure embodying our invention.

In Fig. 1, there is shown a tuning structure 11 having a conducting wire doubled back on itself to form a bifilar-wound coil 13 of helical configuration. At one end of coil 13 a loop 14 is formed where the wire is doubled back on itself. At the other end of coil 13, remote from the loop 14, the two ends of the wire provide terminals 15 and 16 for connection to a suitable circuit as desired. Coil 13 is tuned by an adjustable tuning member 17 in the form of a double-threaded tuning screw having a thread pitch equal to the pitch of the winding of coil 13 and a thread gage such that the tuning member fits snugly within the turns of the coil. Tuning member 17 is provided with a conventional slot 18 in order to adjust the depth of entrance of said member within the tuning coil 13.

In the form of the invention illustrated in Fig. 1, the coil 13 and tuning member 17 are mounted in a tube 19 of non-conducting material such as an insulating plastic of the polystyrene type. To facilitate assembly of the coil 13 and shorting screw 17 in the tube 19, the latter is provided with a loop-receiving slot 20 in its upper end and a terminal-receiving slot 21 extending along its entire length. By aligning the loop 14 and the terminals 15 and 16 with their respective slots 20 and 21, coil 13 and screw 17 can be readily slid into position in tube 19. A notched portion 22 is provided in terminal slot 21 to receive terminals 15 and 16 and thereby prevent axial movement of coil 13 relative to tube 19. Tube 19 may have a reduced portion 23 at its lower end to facilitate mounting of the tuning structure 11. Reduced portion 23 may, for example, be inserted in a suitable mounting hole in a television chassis or in a mounting block designed to hold one or more tuning structures and may be cemented in place as desired.

The coil 13 is formed of a good conducting wire such as copper and is preferably coated with a higher-order conducting material, such as silver, in order to provide a surface that affords good electrical contact with tuning member 17. Tuning member 17 is preferably formed of a conductive non-magnetic material, such as brass, and is also preferably coated with a higher-order conducting material, such as silver.

It has been considered that the coil 13 and screw 17 might alternatively be insulated from each other, but tests conducted with sample coils formed of wires coated with a thin layer of electrical insulating material, specifically, a phenolic resin modified polyvinylal resin type enamel, showed a reduction of the frequency range covered by the coil to about one-tenth that of the structure using wire having a surface that provides a good electrical contact with the tuning screw. This is believed to be due to the fact that the insulated wire gives a capacitive short circuit rather than a direct short circuit.

We believe that the operating characteristics of our improved tuning structure may be explained on the basis that its configuration is, in effect, that of a two-wire transmission line. Although, the helical configuration of the line, and the close proximity of adjacent turns, doubtless are responsible for some interaction between turns, its bifilar construction is thought to result in cancellation, for the most part, of inductive effects set up in the structure due to interaction between turns.

As is well-known, a two-wire transmission line exhibits characteristics similar to those of a series resonant circuit. Depending upon whether the line termination is that of a short circuit or an open circuit, and depending upon its length relative to the wave-length of a given input signal, the device is resonant or exhibits inductive or capacitance reactance. If the line is short-circuited, it exhibits inductive reactance when its length is less than one-quarter wave length. Thus, it may be considered that this structure provides improved means for adjusting the effective length of a two-wire transmission line in the form of a helically-wound coil. In any event, whatever may be the correct theory of its operation, it has been demonstrated in practice to provide an inductance component suitable for tuning very-high-frequency and ultra-high-frequency circuits over relatively wide frequency ranges.

It should be noted that the shorting screw 17 is preferably of sufficient length with respect to the length of coil 13 that when it is screwed into the coil, the unused turns close to the active line are effectively shorted out due to the continuous contact between the tuning member 17 and the coil 13. This is an important consideration in view of the end-effects that would otherwise be present and which would reduce the effective tuning range of the structure.

Figure 2:
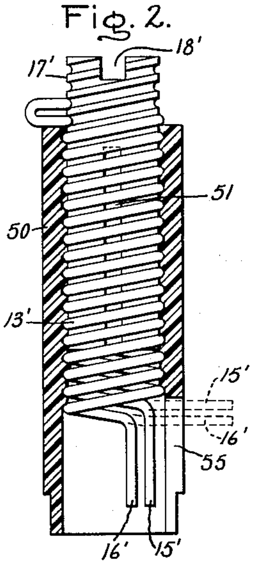
Fig. 2 is an elevational view, partly in section, of another structure embodying our invention.
Figure 3:
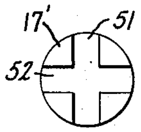
Fig. 3 is an end view of the shorting screw member employed in the embodiment shown in Fig. 2.

In Fig. 2 there is seen an alternate form of mounting for the inductance structure described above. According to this arrangement, a bifilar helical coil 13′, similar to coil 13 of Fig. 1, is enclosed in an internally-threaded plastic tube 50. As best seen in Fig. 3, a shorting member 17′, corresponding to member 17 of Fig. 1, is provided with a pair of slots 51 and 52 at right angles to one another extending along its axis from a point below the screw head on through the opposite end. This arrangement provides axial resiliency in member 17′ in order to insure positive electrical contact at all points along the threaded line between coil 13′ and shorting member 17′. In this modification, terminals 15′ and 16′ are disposed within the circumference of tube 50 to permit the coil 13′ to be screwed into the tube 50. However, after coil 13′ is thus screwed into position, the terminals 15′ and 16′ may be bent into a slot 55 in tube 50, as indicated by the dashed lines in Fig. 2.

Figure 4:
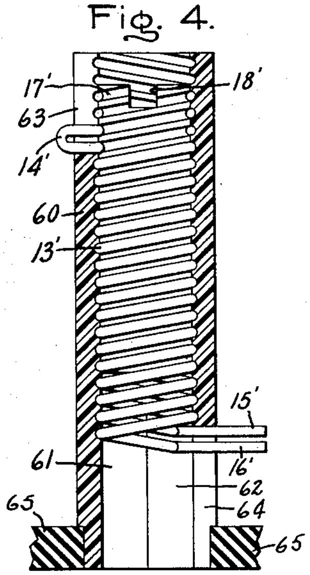
Fig. 4 is an elevational view, partly in section, of still another structure embodying our invention.

Referring now to Fig. 4, another suitable mounting for the above-described inductance structure is that illustrated. A bifilar wound coil 13′, similar to coil 13 of Fig. 1, is surrounded by an internally threaded plastic tube 60. The tube 60 comprises a pair of semi-cylindrical segments 61 and 62 which fit snugly over coil 13′. The first segment 61 is provided with a loop-receiving slot 63 in its upper end to receive a loop 14′, corresponding to loop 14 of Fig. 1. The second segment 62 is provided with a terminal-receiving slot 64 in its lower end to receive the terminals 15′ and 16′, corresponding to terminals 15 and 16 of Fig. 1. In their assembled position, the two segments 61 and 62 are clamped together over coil 13′ with loop 14′ and terminals 15′ and 16′ in their respective slots 63 and 64. The two segments 61 and 62 are preferably held together in opposed relation by means of a suitable fastener such as cement or a suitable clamping member or interlock (not shown) and may then be inserted in a mounting block 65 in a manner similar to that prescribed for the tube structure shown in Fig. 1.

It is apparent that the slots 63 and 64 may readily be replaced by simple holes where manufacturing problems warrant it.

Although tube 60 is shown and described as having threads in its inner surface to provide structural stability to the coil 13′, in certain cases these threads may be omitted where their additional structure-stabilizing properties are not required. Furthermore, while tube 60 is shown as comprising two semi-cylindrical segments, the number of segments may, in some instances, exceed two in number if desired, and they need not be of equal arcuate or circumferential dimensions.

Still other suitable methods of mounting the tuning structure shown in Fig. 1 will readily be apparent to those skilled in the art. According to one other method (not illustrated), the coil may be threaded into a plastic tube having internal threads, as shown in Fig. 2, but with the shorting member in the form of a solid screw member as shown in Fig. 1. In such case, the plastic tube is provided with one or more longitudinal slots in order to give the necessary resiliency to insure good electrical contact all along the thread line between coil and shorting member.

Figure 5:
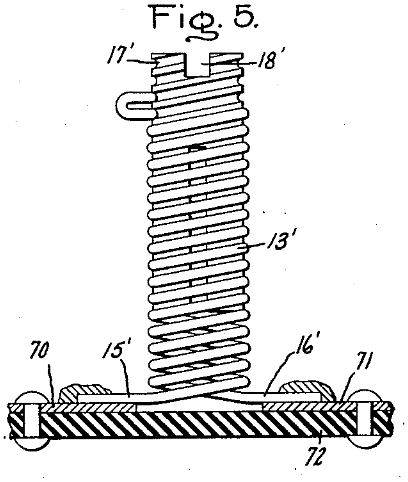
Fig. 5 is an elevational view of a further structure embodying our invention.

As illustrated in Fig. 5, it may be desirable in some other cases to wind the inductance coil 13′ of a sufficiently heavy gauge wire to form a self-supporting type structure that may be mounted directly by means of its terminal wires 15′ and 16′ in a conventional manner such as by soldering them to the terminal lugs 70 and 71 of a terminal strip 72. Although terminal wires 15′ and 16′ diverge from their parallel relationship in being connected to the widely-spaced terminal lugs 70 and 71, the tuning frequency range of the present tuning structure is not impaired thereby.

Although our tuning structure has been described with specific reference to a coil structure having an internal shorting screw member, it will be apparent that in some cases, particularly where the coil is of the self-supporting type as shown in Fig. 5, it may be desirable to employ a shorting screw member that is external to the coil structure.

Figure 6:
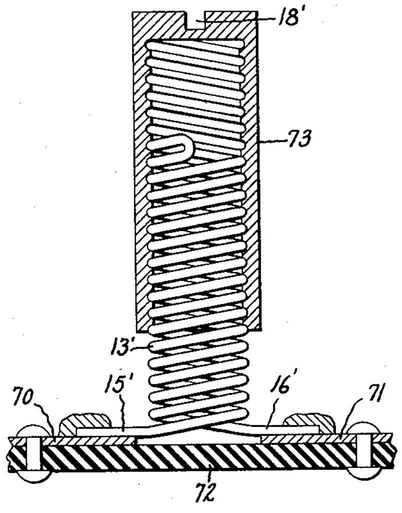
Fig. 6 is an elevational view, partly in section, of a still further structure embodying our invention.

Referring now to Fig. 6, there is shown an external shorting member 73 which may be of generally cup-shaped configuration having internal screw threads corresponding to the threads of the coil 13′ to be received by it. Coil 13′ of this figure is mounted in a manner similar to that of coil 13′ of Fig. 5. One advantage of such a shorting cup is that it may be combined, to some extent, with a shield can where one is desired.

Figure 7:
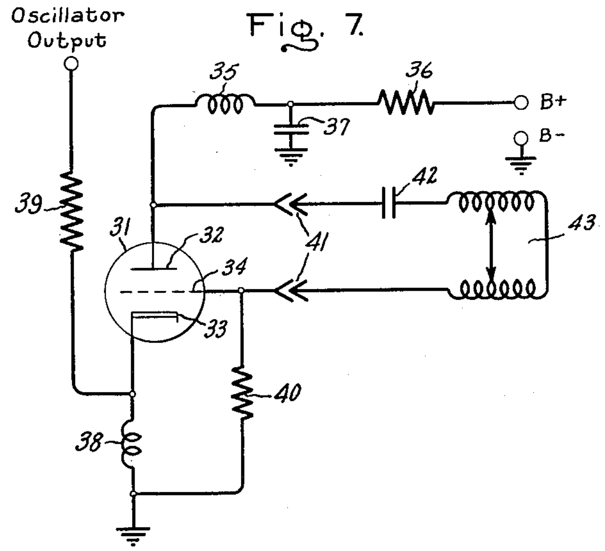
Fig. 7 is a schematic diagram of an oscillator circuit embodying our invention.

Referring now to Fig. 7, there is shown a schematic diagram of a typical oscillator circuit embodying one form of our invention. The oscillator circuit there shown is of a type used in ultra-high-frequency channels of television receivers and the like. A conventional triode-type electron discharge device 31 having an anode 32, a cathode 33 and a control grid 34, has its anode 32 connected to the positive terminal of a source of operating potential (not shown) through a radio frequency choke 35 and a series resistor 36. A capacitor 37, connected between the junction of choke 35 and resistor 36 and ground, cooperates with resistor 36 to filter high frequency oscillations out of the source in a well-known manner. Cathode 33 is connected through a radio-frequency choke 38 to ground. The oscillator output is derived across choke 38 through a decoupling resistor 39. A grid resistor 40 is connected from grid 34 to ground to provide oscillator self-bias in a well-known manner. The oscillator tuned circuit comprises a capacitor 42 connected in series with a variable tuning structure 43 constructed in accordance with our invention. In cases where the oscillator is designed to operate over several different frequency bands, several different tuned circuits may be arranged to be selectively connected in circuit, for example, by means of plug-and-jack connections 41, or the equivalent.

Operating tests have been conducted with one illustrative circuit constructed as shown in Fig. 4, in which a type 6AF4 vacuum tube was used for device 31, and a 2-micromicrofarad capacitor for capacitor 42 of the oscillator tuned circuit. The inductance structure 43 comprised a bifilar coil of 9½ complete turns formed to receive a ¼ inch diameter shorting-screw member having 1/10 inch pitch. The frequency range covered by this particular arrangement was found to extend from about 390 megacycles to about 820 megacycles.

It will therefore be apparent that we have provided improved variable tuning structures particularly suitable for use in very-high-frequency and ultra-high-frequency circuits, which can readily be tuned over relatively wide ranges and which are compact and simple in construction.

While specific embodiments have been shown and described, it will, of course, be understood that various modifications may be made without departing from the principles of the invention. The appended claims are, therefore, intended to cover any such modifications within the true spirit and scope of the invention.

What we claim as new and desire to secure by Letters Patent of the United States is:

1. A variable tuning structure including a pair of parallel conductors terminating in a short circuiting loop at one end and having a pair of terminals at the other end and formed into a bifilar coil of helical configuration, means for adjustably tuning said structure comprising a threaded conductive, non-magnetic member within said coil in movable contact therewith, provided with threads having a pitch equal to the pitch of the turns of said coil and having a diameter substantially equal to the internal diameter of said turns of said coil, and means for supporting said tuning structure, said supporting means comprising a tubular member of non-conductive material closely fitted over said coil and provided with a slotted portion in one end, said pair of terminals being inserted in said slotted portion.

2. A variable tuning structure including a pair of parallel conductors terminating in a short circuiting loop at one end and having a pair of terminals at the other end and formed into a bifilar coil of helical configuration, means for adjustably tuning said structure comprising a threaded conductive, non-magnetic member within said coil in movable contact therewith, provided with threads having a pitch equal to the pitch of the turns of said coil and having a diameter substantially equal to the internal diameter of said turns of said coil, and means for supporting said tuning structure, said supporting means comprising a plurality of longitudinal segments of a tubular member of non-conductive material closely surrounding said coil including a first segment provided with an aperture therein, said loop being inserted in said aperture and a second segment provided with an aperture therein, said terminals being inserted in said latter aperture.

References Cited in the file of this patent

UNITED STATES PATENTS

| | | |
|---|---|---|
| 1,904,208 | Dow | Apr. 18, 1933 |
| 2,126,541 | De Forest | Aug. 9, 1938 |
| 2,160,655 | Hansell | May 30, 1939 |
| 2,292,254 | Van Beuren | Aug. 4, 1942 |
| 2,404,404 | Roberds | July 23, 1946 |
| 2,505,178 | French | Apr. 25, 1950 |
| 2,599,126 | Reed | June 3, 1952 |
| 2,649,577 | Armstrong | Aug. 18, 1953 |
| 2,682,642 | Podolsky | June 29, 1954 |